US010080290B2

(12) United States Patent
Aleksov et al.

(10) Patent No.: US 10,080,290 B2
(45) Date of Patent: Sep. 18, 2018

(54) STRETCHABLE EMBEDDED ELECTRONIC PACKAGE

(71) Applicant: Intel Corporation, Santa Clara, CA (US)

(72) Inventors: Aleksandar Aleksov, Chandler, AZ (US); Srinivas Pietambaram, Gilbert, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 14/943,234

(22) Filed: Nov. 17, 2015

(65) Prior Publication Data

US 2017/0142839 A1    May 18, 2017

(51) Int. Cl.
| | |
|---|---|
| *H05K 1/18* | (2006.01) |
| *H05K 1/02* | (2006.01) |
| *H05K 1/11* | (2006.01) |
| *H05K 3/00* | (2006.01) |
| *H05K 3/46* | (2006.01) |

(52) U.S. Cl.
CPC .......... *H05K 1/184* (2013.01); *H05K 1/0283* (2013.01); *H05K 1/0298* (2013.01); *H05K 1/113* (2013.01); *H05K 3/007* (2013.01); *H05K 3/4697* (2013.01)

(58) Field of Classification Search
CPC ....... H05K 1/184; H05K 1/0283; H05K 1/113
See application file for complete search history.

(56) References Cited

U.S. PATENT DOCUMENTS

| 7,472,836 B2* | 1/2009 | Farooq ............. G06K 19/07381 235/487 |
| 8,323,771 B1* | 12/2012 | Huemoeller ........... H05K 1/116 174/265 |
| 9,603,247 B2* | 3/2017 | Swaminathan ..... H01L 23/5381 |
| 9,832,863 B2* | 11/2017 | Elsherbini ............. H05K 1/028 |

(Continued)

FOREIGN PATENT DOCUMENTS

KR     1020150125797 A     11/2015

OTHER PUBLICATIONS

"International Application Serial No. PCT/US2016/053400, International Search Report dated Jan. 9, 2017", 3 pgs.

(Continued)

*Primary Examiner* — Binh Tran
*Assistant Examiner* — Douglas Burtner
(74) *Attorney, Agent, or Firm* — Schwegman Lundberg & Woessner, P.A.

(57) ABSTRACT

An embedded electronic package includes a stretchable body that includes at least one electronic component, wherein each electronic component includes a back side that is exposed from the stretchable body; and a plurality of meandering conductors that are electrically connected to one or more of the electronic components. In some forms, the embedded electronic package includes a stretchable body that includes an upper surface and a lower surface, wherein the stretchable body includes at least one electronic component, wherein each electronic component is fully embedded in the stretchable body and the same distance from the upper surface of the stretchable body; and a plurality of meandering conductors that are electrically connected to one or more of the electronic components.

5 Claims, 11 Drawing Sheets

(56) References Cited

U.S. PATENT DOCUMENTS

| | | | | |
|---|---|---|---|---|
| 9,860,979 B2* | 1/2018 | Ichiryu | | H05K 1/0283 |
| 9,905,928 B2* | 2/2018 | de Rochemont | | H01Q 9/0414 |
| 9,942,980 B2* | 4/2018 | Hu | | H05K 1/0283 |
| 2005/0062486 A1* | 3/2005 | Qi | | H01B 1/124 |
| | | | | 324/693 |
| 2006/0231288 A1* | 10/2006 | Vanfleteren | | H01L 25/50 |
| | | | | 174/254 |
| 2007/0019353 A1* | 1/2007 | Ishii | | H02H 9/005 |
| | | | | 361/118 |
| 2008/0105527 A1* | 5/2008 | Leftly | | H01H 13/7006 |
| | | | | 200/530 |
| 2009/0317639 A1* | 12/2009 | Axisa | | B32B 37/185 |
| | | | | 428/411.1 |
| 2010/0155109 A1* | 6/2010 | Takahashi | | H05K 1/028 |
| | | | | 174/254 |
| 2012/0007211 A1* | 1/2012 | Aleksov | | H01L 22/32 |
| | | | | 257/508 |
| 2012/0051005 A1* | 3/2012 | Vanfleteren | | H01L 21/565 |
| | | | | 361/749 |
| 2012/0119367 A1* | 5/2012 | Haba | | H01L 23/49838 |
| | | | | 257/773 |
| 2012/0188734 A1* | 7/2012 | Mikado | | H05K 1/185 |
| | | | | 361/761 |
| 2012/0325537 A1* | 12/2012 | Toyao | | H05K 1/0236 |
| | | | | 174/260 |
| 2013/0009851 A1* | 1/2013 | Danesh | | H01G 9/20 |
| | | | | 343/904 |
| 2015/0092369 A1* | 4/2015 | Gouchi | | H05K 1/186 |
| | | | | 361/762 |
| 2016/0353567 A1* | 12/2016 | Ichiryu | | H05K 1/0283 |
| 2016/0358849 A1* | 12/2016 | Jur | | H05K 1/0283 |
| 2017/0040306 A1* | 2/2017 | Kim | | H01L 25/167 |
| 2017/0127517 A1* | 5/2017 | Ishihara | | H05K 1/056 |
| 2018/0049309 A1* | 2/2018 | Elsherbini | | H05K 1/0283 |

OTHER PUBLICATIONS

"International Application Serial No. PCT/US2016/053400, Written Opinion dated Jan. 9, 2017", 6 pgs.

* cited by examiner

ADD CARRIER AND ELECTRONIC COMPONENT TO DOUBLE SIDE TAPE

ENCAPSULATE ELECTRONIC COMPONENT WITH STRETCHABLE MATERIAL

FORM OPENINGS STRETCHABLE MATERIAL

SEED DEPOSITION AND TRACE PATTERNING

VIA AND TRACE FORMATION AND RESIST AND SEED LAYER REMOVAL

ADD ADDITIONAL STRETCHABLE MATERIAL

EXPOSE PADS

CARRIER AND TAPE REMOVAL

ADD FIRST CARRIER AND ELECTRONIC COMPONENT TO DOUBLE SIDED TAPE

ENCAPSULATE ELECTRONIC COMPONENT WITH STRETCHABLE MATERIAL

REMOVE TAPE AND CARRIER - ATTACH TAPE AND SECOND CARRIER

FORMING OPENINGS IN THE STRETCHABLE MATERIAL

SEED DEPOSITION AND TRACE PATTERNING

PADS
MEANDERING TRACES

VIA AND TRACE FORMATION AND RESIST AND SEED LAYER REMOVAL

ADD ADDITIONAL STRETCHABLE MATERIAL

STRETCHABLE EMBEDDED ELECTRONIC PACKAGE

TECHNICAL FIELD

Embodiments described herein generally relate to an electronic package, and more particularly to a stretchable embedded electronic package.

BACKGROUND

Stretchable computing devices enable various approaches to managing different types of applications where computing power may be utilized to enhance the application. As examples, healthcare and fitness are applications that may utilize stretchable computing devices. Sometimes the size and/or the shape of an electronic device makes it challenging to provide input (e.g., from a sensor) into a stretchable computing device.

One class of stretchable computing devices that is rising in importance relates to textiles which include integrated electronic devices. There may be a variety of operational and manufacturing concerns associated with incorporating integrated electronic devices that are part of electronic packages or electronic systems into textiles that are meant to be worn on the body.

One known limitation with conventional printed circuit board (PCB) technology relates to using rigid PCB technology for stretchable applications. Using rigid PCB technology for stretchable applications (e.g., wearable devices) may be problematic because in many applications stretchability of up to 30% may be desired.

Some conventional electronic packages use a flexible PCB. However, typical flexible PCB manufacturing processes usually produce a relatively expensive structure.

In addition, assembling various electronic components to flexible boards may be very challenging, especially when fabricate multi-layer flexible boards. Flexible boards also typically (and undesirably) have much larger critical dimensions as compared to electronic packages that include rigid boards. These much larger critical dimensions in flexible boards limit the I/O density and circuit complexity of an electronic system that includes the flexible board.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

In some forms, the example embedded electronic packages described herein may be integrated with (or attached to) textiles (i.e. clothing). In other forms, the example embedded electronic packages may be attached directly to the skin of someone (i.e., similar to a bandage) that utilizes any of the example stretchable electronic assemblies described herein.

As used herein "stretchable" refers to the ability elongate in the direction of an applied force. The amount of stretching will be determined in part on the application where any of the example stretchable electronic assemblies described herein are to be used. As an example, the degree of stretching may be different when the example stretchable embedded electronic packages described herein are integrated with (or detachably connected to) textiles (i.e. clothing) as opposed when the example stretchable embedded electronic packages described herein are attached directly to the skin of someone that utilizes any of the example stretchable embedded electronic packages.

Figure 1:
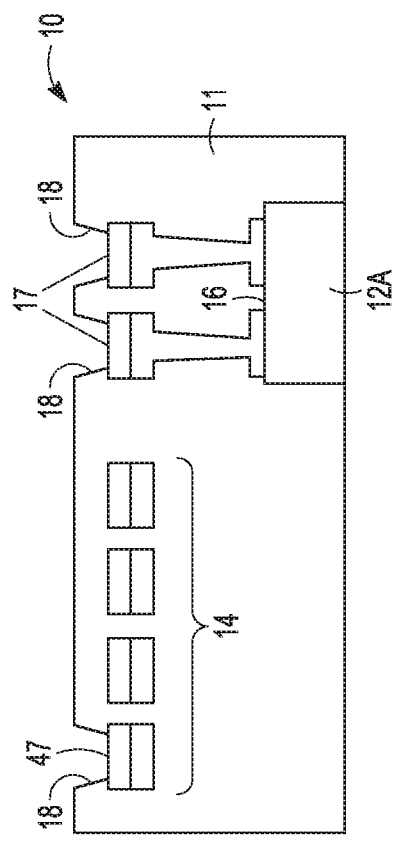
FIG. 1 is a schematic side view illustrating an example embedded electronic package.

FIG. 1 is a schematic side view illustrating an example embedded electronic package 10. The embedded electronic package 10 includes a stretchable body 11 that includes at least one electronic component 12.

Figure 2:
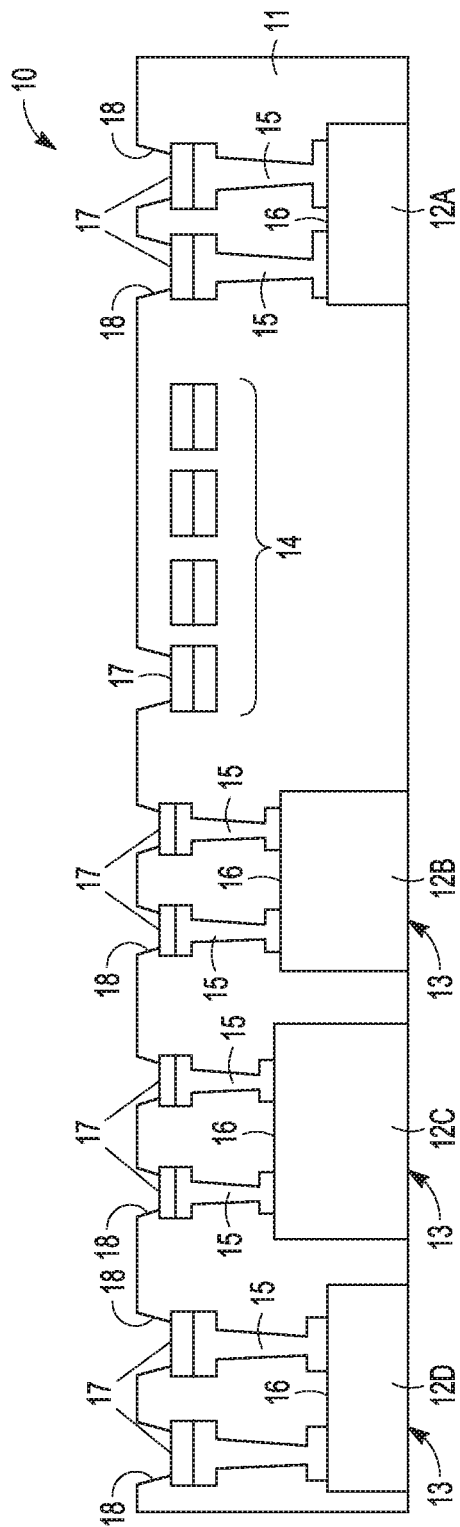
FIG. 2 is a schematic side view illustrating an example embedded electronic package similar to FIG. 1 where the embedded electronic package includes a plurality of electronic components.

FIG. 2 is a schematic side view illustrating an example embedded electronic package 10 where the embedded electronic package 10 includes a plurality of electronic components 12A, 12B, 12C, 12D. Each electronic component 12A, 12B, 12C, 12D includes a backside 13 that is exposed from the stretchable body 11. A plurality of meandering conductors 14 are electrically connected to one or more of the electronic components 12A, 12B, 12C, 12D.

It should be noted that each of the electronic components 12A, 12B, 12C, 12D may be the same, partially the same or different electronic components. The type and arrangement of electronic components 12A, 12B, 12C, 12D that are included in the embedded electronic package 10 will depend in part on the application where the embedded electronic package 10 is to be used (among other factors).

In some forms, the stretchable body 11 includes an elastomer material. As an example, the stretchable material 11 that covers the meandering conductors 14 may be silicone elastomers (e.g., polymethyldisiloxane (PDMS)), thermoplastic polyurethane (TPU), and/or polyimide, epoxy, epoxy and/or polyimide filled with various micro and/or nano fillers, such as silica particles and acrylate. The type of material that is used for the stretchable body will depend in part on the application where the embedded electronic package is to be used as well as the degree of flexibility that is required within the stretchable body 11 (among other factors).

In some forms, the plurality of meandering conductors 14 may have a serpentine shape. It should be noted that a variety of shapes (including three-dimensional shapes) are contemplated for the meandering conductors 14. The size, type and shape of meandering conductors 14 that are included in the embedded electronic packages 10 will depend on a variety of manufacturing and operational considerations.

As shown in FIGS. 1 and 2, the embedded electronic package 10 may further include at least one via 15 embedded within the stretchable body 11 and extending from an opposing side 16 of each electronic component 12A, 12B, 12C, 12D. The embedded electronic package 10 further includes a plurality of conductive pads 17 that are embedded within the stretchable body 11. Each via 15 may be electrically connected to one of the meandering conductors 14 or one of the pads 17. In addition, each meandering conductor 14 may be electrically connected to a via 15 or a pad 17 (or both a via 15 and a pad 17). The stretchable body 11 includes openings 18 that expose the conductive pads 17.

In some forms, the embedded electronic package 10 further includes a textile T (see FIG. 7) such that the stretchable body 11 is attached to the textile T. In addition, at least one of the electronic components 12A, 12B, 12C, 12D may be a sensor, a die, a passive, a power supply and/or an antenna. The types of electronic components that are included in the embedded electronic package 10 will depend in part on manufacturing considerations as well as the application where the embedded electronic package is to be utilized (among other factors).

FIGS. 3A-3H are schematic side views illustrating an example process for fabricating the embedded electronic package 10 of FIG. 1. It should be noted that the illustrated example processes may be performed in a different order or include different manufacturing techniques.

Figure 4:
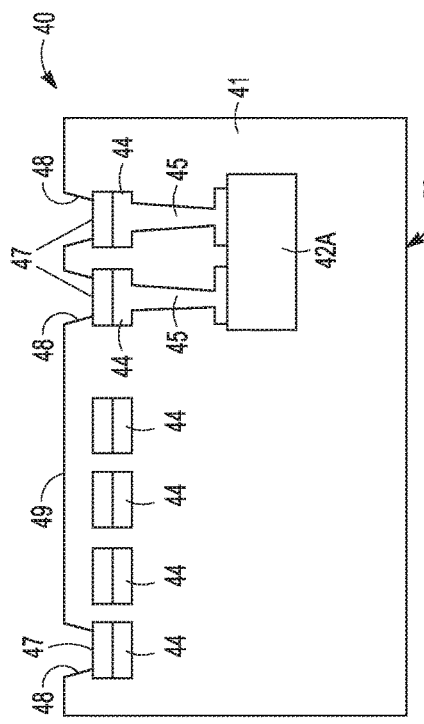
FIG. 4 is a schematic side view illustrating another example embedded electronic package.
Figure 5:
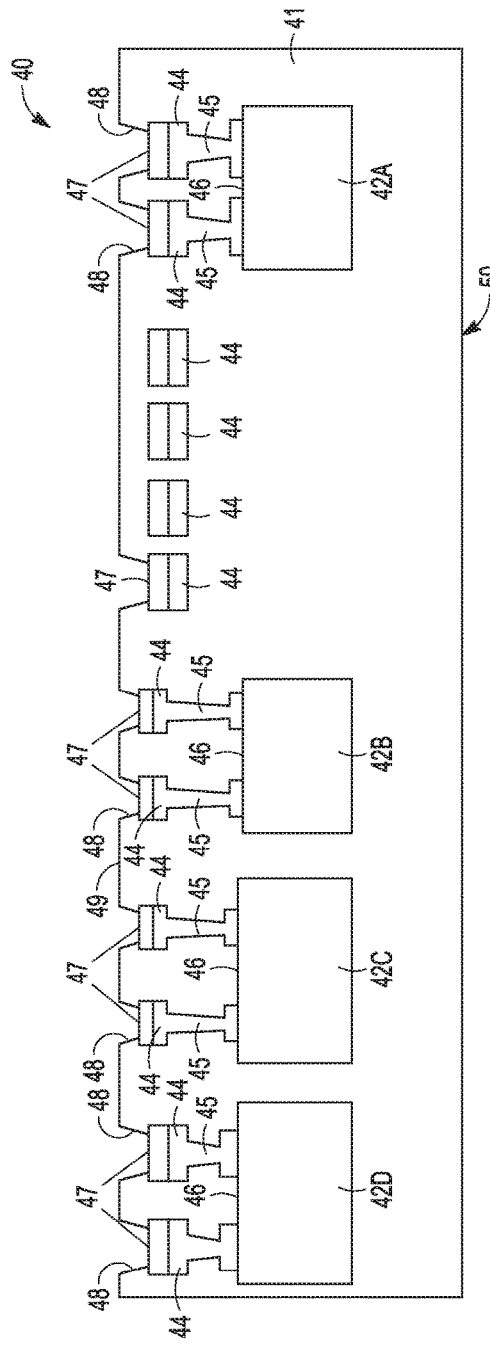
FIG. 5 is a schematic side view illustrating an example embedded electronic package similar to FIG. 4 where the embedded electronic package includes a plurality of electronic components.

FIG. 4 is a schematic side view illustrating another example embedded electronic package 40 that includes an electronic component 42A. FIG. 5 is a schematic side view illustrating an example embedded electronic package 40 similar to FIG. 4 where the embedded electronic package 40 includes a plurality of electronic components 42A, 42B, 42C, 42D.

The embedded electronic package 40 includes a stretchable body 41 that includes an upper surface 49 and a lower surface 50. Each electronic component 42A, 42B, 42C, 42D is fully embedded in the stretchable body 41 and is the same distance from the upper surface 49 of the stretchable body 41.

A plurality of meandering conductors 44 are electrically connected to one or more of the electronic components 42A, 42B, 42C, 42D. It should be noted that the plurality of meandering conductors 44 may be similar to any of the meandering conductors 14 described above. In addition, the stretchable body 41 may be similar to any of the stretchable bodies 11 described above.

The embedded electronic package 40 further includes at least one via 45 that is embedded within the stretchable body 41. The vias 45 extend from the active side 46 of each electronic component 42A, 42B, 42C, 42D.

A plurality of conductive pads 47 is embedded within the stretchable body 41. Each via 45 may be electrically connected to one of the meandering conductors 44 or one of the pads 47. In addition, each meandering conductor 44 may be electrically connected to a via 45 or a pad 47 (or both a via 45 and a pad 47). The stretchable body 41 includes openings 48 that expose the conductive pads 47.

In some forms, the embedded electronic package 40 further includes a textile T (see FIG. 7) such that the stretchable body 41 is attached to the textile T. In addition, at least one of the electronic components 42A, 42B, 42C, 42D may be a sensor, a die, a passive, a power supply and/or an antenna. The types of electronic components that are included in the embedded electronic package 40 will depend in part on manufacturing considerations as well as the application where the embedded electronic package is to be utilized (among other factors).

FIGS. 6A-6I are schematic side views illustrating an example process for fabricating the embedded electronic package 40 of FIG. 4. It should be noted that the illustrated example processes may be performed in a different order or include different manufacturing techniques.

FIGS. 3A-3H and 6A-6I illustrate that the processes may utilize a temporary carrier panel. The temporary carrier panel may have different configurations. As an example, the temporary carrier panel may have two copper layers that are separated by a weak layer to permit easy separation when separating the embedded electronic packages 10, 40 from the temporary carrier panel. It should be noted that a variety of configurations for the temporary carrier panel are contemplated and will depend in part on the materials and manufacturing processes that are utilized to fabricate the embedded electronic packages 10, 40.

It should be noted that in all of the processes that are shown and described herein, individual units may be singulated from a wafer panel. In addition, the singulated units may be encapsulated and/or attached to other electronic assemblies or electronic packages.

All of the illustrated processes and flow diagrams are merely examples and other processes, materials, components, configurations and attachment methods may be utilized. These example processes and flow diagrams should not be viewed as limiting the scope of the embedded electronic packages 10, 40 described herein.

Figure 7:
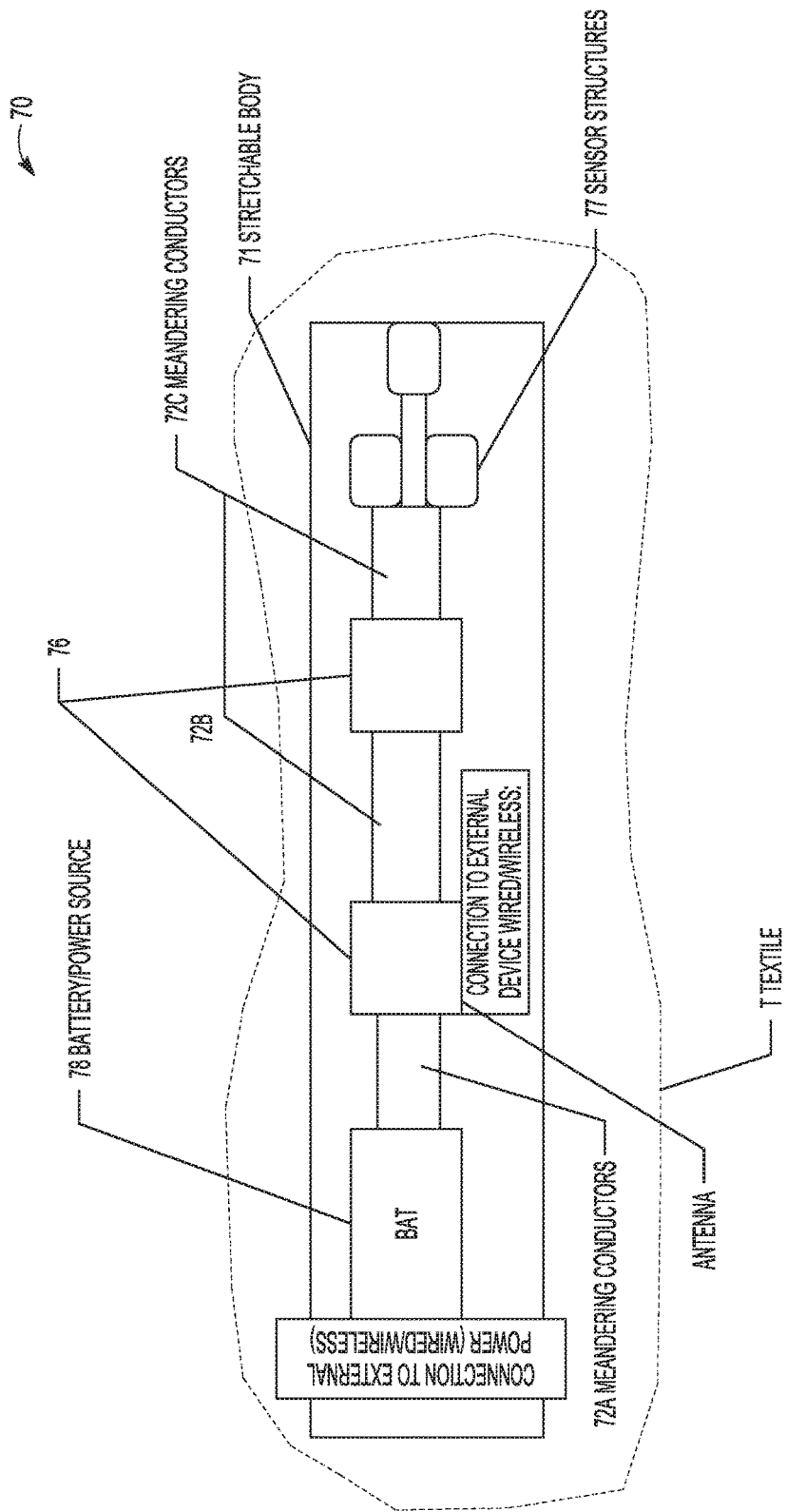
FIG. 7 is a schematic top view illustrating an example stretchable electronic assembly that may include any of the embedded electronic packages described herein.

FIG. 7 is a schematic top view illustrating an example stretchable electronic assembly 70 that may include any of the stretchable embedded electronic packages 10, 40 described herein. The stretchable electronic assembly 70 includes a stretchable body 71 that includes electronic components. A plurality of meandering conductors 72A, 72B, 72C electrically connect the electronic components.

A plurality of conductive pads are electrically connected to at least one of the electronic components or some of the plurality of meandering conductors 72A, 72B, 72C. The plurality of conductive pads may be exposed from the stretchable body 71.

In some forms, at least one of the electronic components is similar to one or more of the embedded electronic packages 10, 40 described herein. Alternatively, or in addition to, at least one of the electronic components may be a sensor 77. In addition, at least one of the electronic components may be a power source 78.

In some example forms, at least one of the electronic components may send wired or wireless signals to a user interface (not shown). As an example, at least one of the electronic components may include (or be attached to) an antenna that sends and receives wireless signals to an external device.

The stretchable electronic assembly 70 may further include a textile T. The stretchable body 71 may be attached to the textile T in any manner that is known now or discovered in the future. The type of textile T that is attached to the electronic assembly 10 will depend on in part on the application where the stretchable electronic assembly 10 is to be used (among other factors The example stretchable electronic assembly 70 described herein may permit the use of high volume manufacturing processes that permit the stretchable electronic assemblies 70 to be incorporated into various textiles, garments, clothes, etc., or directly onto the human body. In addition, the example stretchable electronic assemblies 70 described herein may allow a designers to provide for an electronic device that includes highly dense electronic systems as well as allow readily permit hardware programming access.

In addition, the example stretchable electronic assembly 70 may include different types of pads for connectivity to additional sensors or power sources as well as potentially permit wireless connectivity using various antenna designs. As an example, different antennas may be used for wireless charging and communication.

It should be noted that various types of sensors 77 may be connected to the stretchable body 71, or the stretchable body 71 may include components that permit electrical connection to various types of sensors 77. The types of sensors that are included in the stretchable electronic assembly 70 will depend in part on the application where the stretchable electronic assembly 70 is to be used (among other factors).

Figure 8:
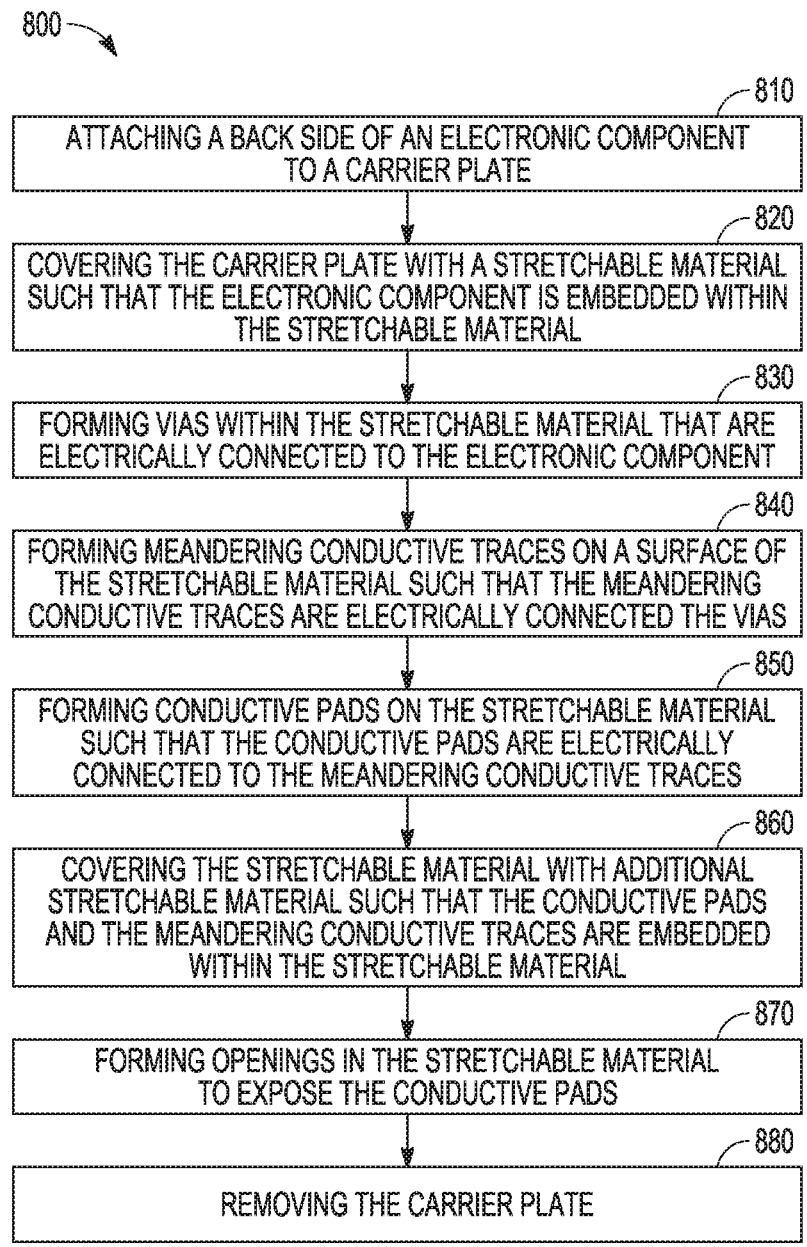
FIG. 8 shows a flow diagram illustrating an example method of fabricating an embedded electronic package.

FIG. 8 shows a flow diagram illustrating an example method [800] of fabricating an embedded electronic package 10. Referring also to FIGS. 1-3H, the method [800] includes [810] attaching a backside 13 of an electronic component 12A to a carrier plate (see FIG. 3A).

Figure 3A:
FIGS. 3A-3H are schematic side views illustrating an example process for fabricating the embedded electronic package of FIG. 1.
Figure 3B:
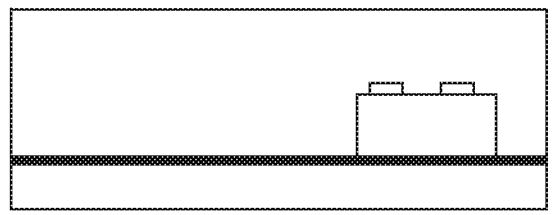
Figure 3C:
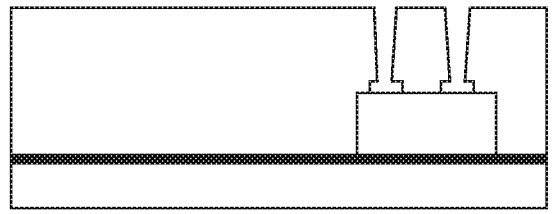
Figure 3D:
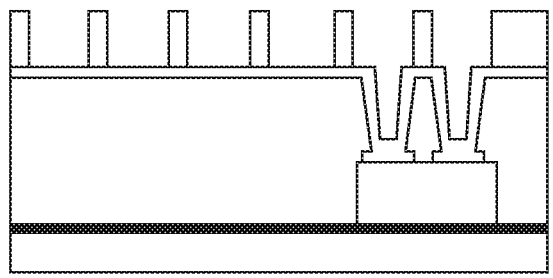

The method [800] further includes [820] covering the carrier plate with a stretchable material 11 such that the electronic component 12A is embedded within the stretchable material 11 (see FIG. 3B). The method [800] further includes [830] forming vias 15 within the stretchable material such that the vias 15 are electrically connected to the electronic component 12A (see FIGS. 3C-3E). The method [800] further includes forming meandering conductive traces 14 on a surface of the stretchable material 11 such that the meandering conductive traces 14 are electronically connected to the vias 15 (see FIG. 3E).

Figure 3E:
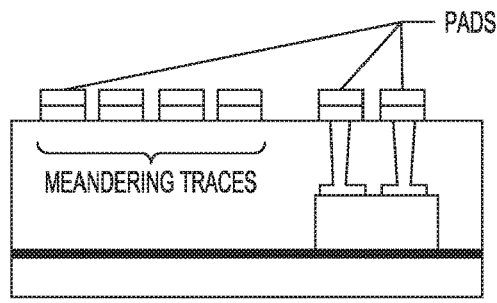
Figure 3F:
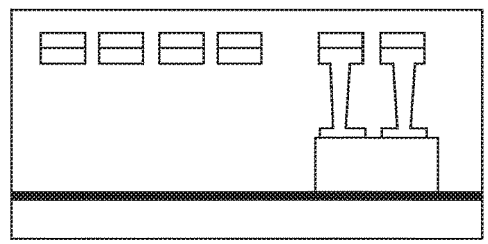

The method [800] further includes [850] forming conductive pads 17 on the stretchable material 11 such that the conductive pads 17 are electrically connected to the meandering conductive traces 14 and/or the vias 15 (see FIG. 3E). The method [800] further includes [860] covering the stretchable material 11 with additional stretchable material 11 such that the conductive pads 17 and the meandering conductive traces 14 are embedded within the stretchable material 11 (see FIG. 3F).

Figure 3G:
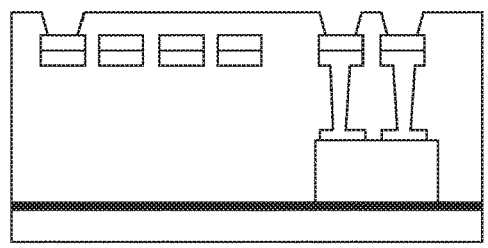
Figure 3H:
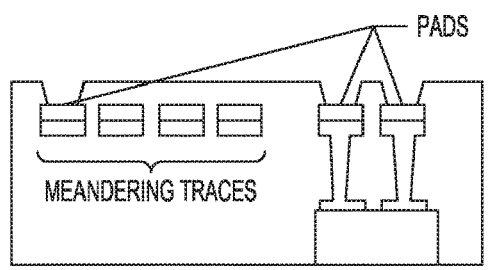

In some forms, the method [800] further includes [870] forming openings 18 in the stretchable material 11 to expose the conductive pads 17 (see FIG. 3G). The method [800] may further include [880] removing the carrier plate from the embedded electronic package 10 (see FIG. 3H).

In some forms, [830] forming vias 15 within the stretchable material 11 includes laser drilling openings in the stretchable material to expose the electronic component 12A and filling the openings with a conductor to form the vias 15. It should be noted that the vias 15 may be formed in the stretchable material in any manner that is known now (e.g., electrolytic plating), or discovered in the future.

In some forms, [810] attaching a backside 13 of an electronic component 12A to a carrier plate may include attaching a backside 13 of a plurality of electronic components 12A, 12B, 12C, 12D to the carrier plate. In addition, [820] covering the carrier plate with a stretchable material 11 may include embedding the plurality of electronic components 12A, 12B, 12C, 12D within the stretchable material 11.

Figure 9:
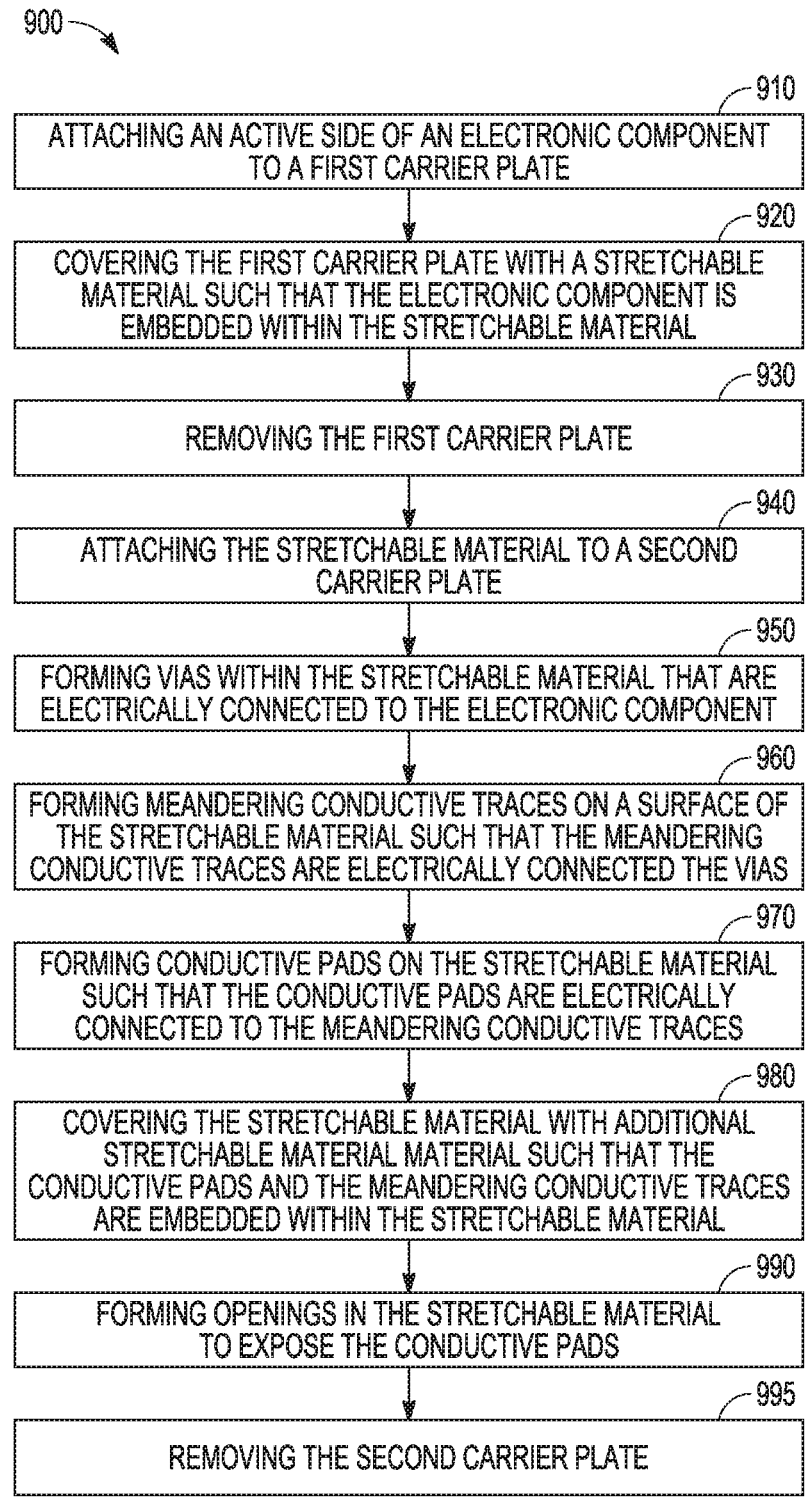
FIG. 9 shows a flow diagram illustrating another example method of fabricating an embedded electronic package.

FIG. 9 shows a flow diagram illustrating another example method [900] of fabricating an embedded electronic package 40. Referring also to FIGS. 4-6I, the method [900] includes [910] attaching an active side 46 of an electronic component 42A to a first carrier plate (see FIG. 6A). The method further includes [920] covering the first carrier plate with a stretchable material 41 such that the electronic component 42A is embedded within the stretchable material 41 (see FIG. 6B). The method further includes [630] removing the first carrier plate (see FIG. 6C), and [640] attaching the stretchable material to a second carrier plate (see FIG. 6C).

Figure 6A:
FIGS. 6A-6I are schematic side views illustrating an example process for fabricating the embedded electronic package of FIG. 4.
Figure 6B:
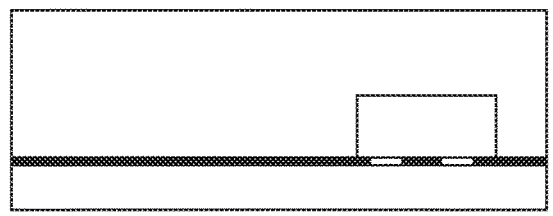
Figure 6C:
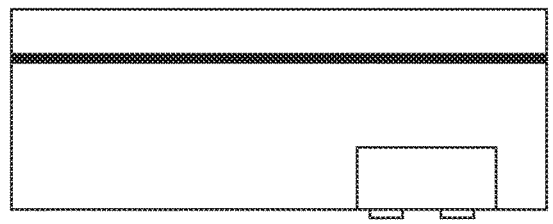
Figure 6D:
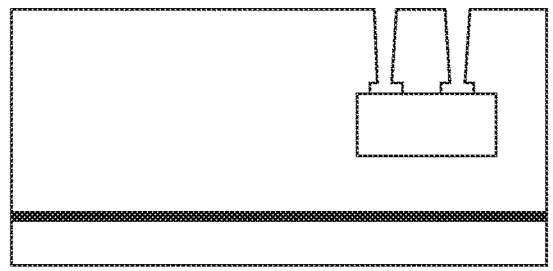
Figure 6E:
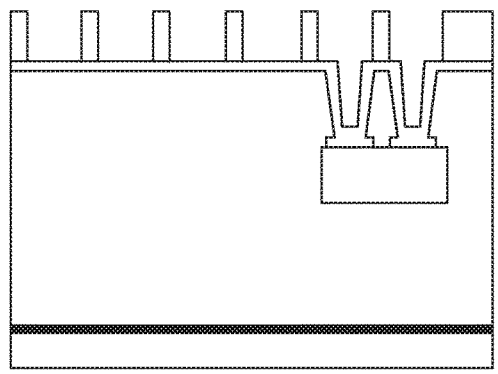
Figure 6F:
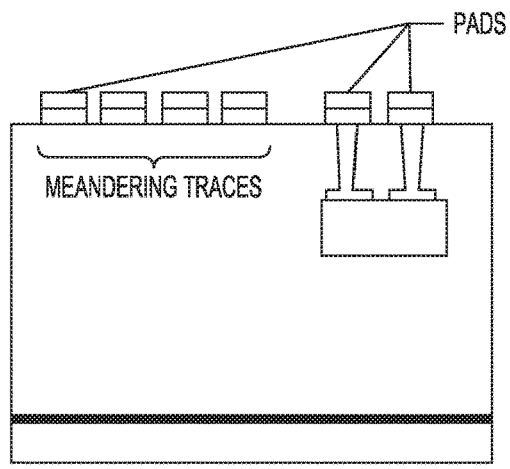
Figure 6G:
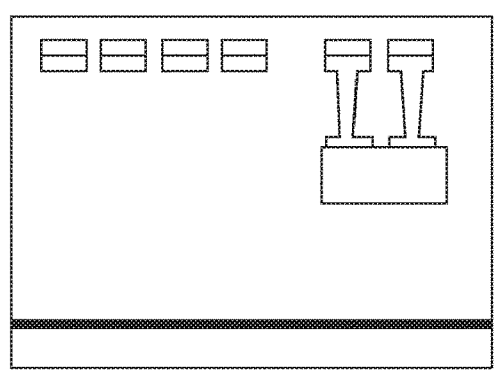
Figure 6H:
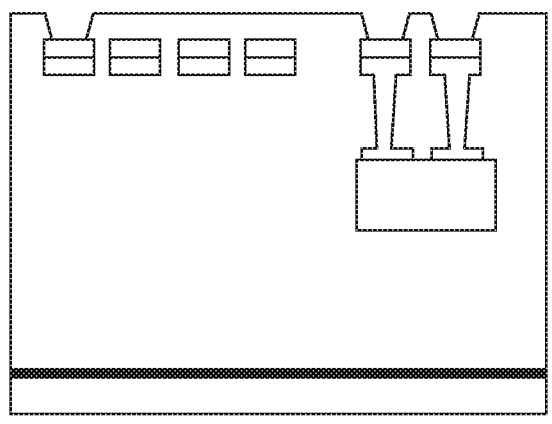
Figure 6I:
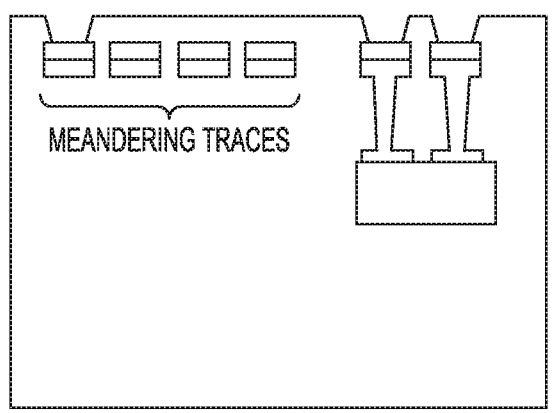

The method [900] further includes [650] forming vias 45 within the stretchable material 41 such that the vias 45 are electrically connected to the electronic component 42A (see FIGS. 6D-6F). The method further includes [600] forming meandering conductive traces 44 on a surface of the stretchable material 41 such that the meandering conductive traces 44 are electrically connected to the vias 45 (see FIG. 6F).

The method [900] further includes [670] forming conductive pads 47 on the stretchable material 41 such that the conductive pads 47 are electrically connected to the meandering conductive traces 44 and the electronic component 42A (see FIG. 6F).

The method [900] further includes [980] covering the stretchable material 41 with additional stretchable material 41 such that the conductive pads 47 and the meandering conductive traces 44 are embedded within the stretchable material 41.

In some forms, the method [900] may further include [990] forming openings 48 in the stretchable material to expose the conductive pads 47. It should be noted that the openings 48 may be formed in the stretchable material 41 in any manner that is known now, or discovered in the future.

The method [900] may further include [995] removing the second carrier plate. It should be noted that the first and second carrier plates may be removed by any technique that is known now, or discovered in the future.

In some forms, [650] forming vias 45 within the stretchable material 41 may include laser drilling openings in the stretchable material 41 to expose the electronic component 42A and permit filling the openings with a conductor to form the vias 45. It should be noted that other methods for forming the openings 48 besides laser drilling are contemplated.

In some forms, [910] attaching an active side 46 of an electronic component 42A to a first carrier plate may include attaching the active side 46 of a plurality of electronic components 42A, 42B, 42C, 42D to the first carrier plate. In addition, [920] covering the first carrier plate with the stretchable material 41 may include embedding the plurality of electronic components 42A, 42B, 42C, 42D within the stretchable material 41.

Figure 10:
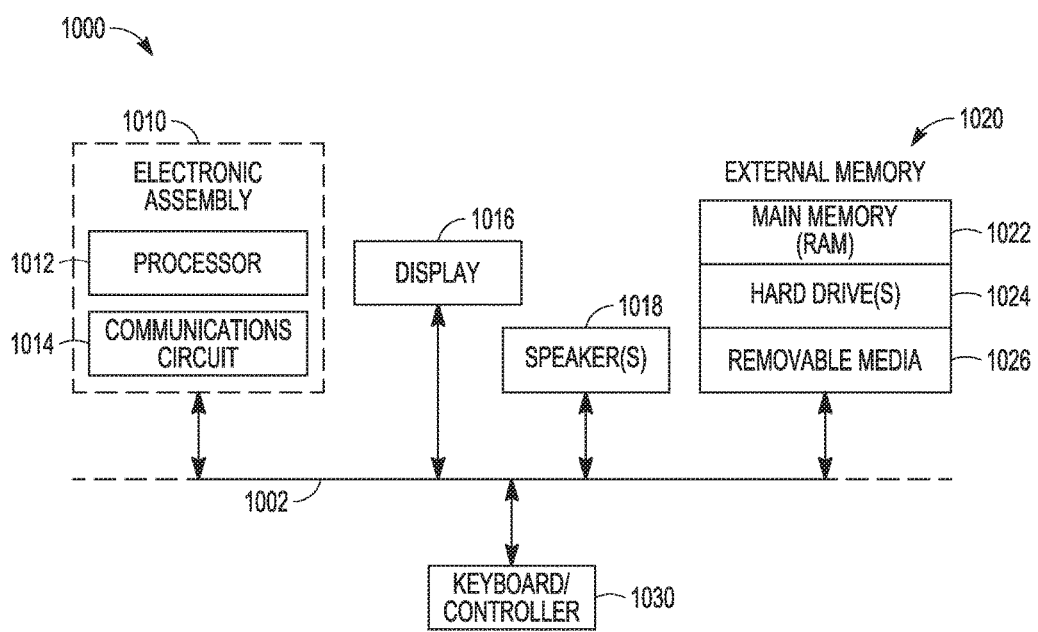
FIG. 10 is block diagram of an electronic apparatus that includes any of the stretchable electronic assemblies described herein.

FIG. 10 is a block diagram of an electronic apparatus 1000 incorporating at least one embedded electronic package 10, 40 and/or method [800], [900] described herein. Electronic apparatus 1000 is merely one example of an electronic apparatus in which forms of the embedded electronic packages 10, 40 and/or methods [800], [900] described herein may be used.

Examples of an electronic apparatus 1000 include, but are not limited to, personal computers, tablet computers, mobile telephones, wearable devices, smart garments, game devices, MP3 or other digital media players, etc. In this example, electronic apparatus 1200 comprises a data processing system that includes a system bus 1002 to couple the various components of the electronic apparatus 1000. System bus 1002 provides communications links among the various components of the electronic apparatus 1000 and may be implemented as a single bus, as a combination of busses, or in any other suitable manner.

An electronic apparatus 1000 as describe herein may be coupled to system bus 1002. The electronic apparatus 1000 may include any circuit or combination of circuits. In one embodiment, the electronic apparatus 1000 includes a processor 1012 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1000 are a custom circuit, an application-specific integrated circuit (ASIC), or the like, such as, for example, one or more circuits (such as a communications circuit 1014) for use in wireless devices like mobile telephones, tablet computers, laptop computers, two-way radios, and similar electronic systems. The IC can perform any other type of function.

The electronic apparatus 1000 may also include an external memory 1020, which in turn may include one or more memory elements suitable to the particular application, such as a main memory 1022 in the form of random access memory (RAM), one or more hard drives 1024, and/or one or more drives that handle removable media 1026 such as compact disks (CD), flash memory cards, digital video disk (DVD), and the like.

The electronic apparatus 1000 may also include a display device 1016, one or more speakers 1018, and a keyboard and/or controller 1030, which can include a mouse, trackball, touch pad, voice-recognition device, or any other device that permits a system user to input information into and receive information from the electronic apparatus 1000.

To better illustrate the embedded electronic packages 10, 40 and/or methods [800], [900] described herein, a non-limiting list of examples is provided herein:

Example 1 includes an embedded electronic package. The embedded electronic package includes a stretchable body that includes at least one electronic component, wherein each electronic component includes a back side that is exposed from the stretchable body; and a plurality of meandering conductors that are electrically connected to one or more of the electronic components.

Example 2 includes the embedded electronic package of example 1, wherein the stretchable body includes an elastomer material.

Example 3 includes the embedded electronic package of any one of examples 1 to 2, wherein the plurality of meandering conductors have a serpentine shape.

Example 4 includes the embedded electronic package of any one of examples 1 to 3, and further including at least one via embedded within the stretchable body and extending from an opposing side of each electronic component; a plurality of conductive pads embedded with the stretchable body, wherein each via and each meandering conductor are electrically connected to one of the pads; and wherein the stretchable body includes openings that expose the conductive pads.

Example 5 includes the embedded electronic package of any one of the examples 1 to 4, and further including a textile, wherein the stretchable body is attached to the textile.

Example 6 includes the embedded electronic package of any one of examples 1 to 5, wherein one of the electronic components is at least one of a sensor, a die, a passive, a power supply or an antenna.

Example 7 includes an embedded electronic package. The embedded electronic package includes a stretchable body that includes an upper surface and a lower surface, wherein the stretchable body includes at least one electronic component, wherein each electronic component is fully embedded in the stretchable body and the same distance from the upper surface of the stretchable body; and a plurality of meandering conductors that are electrically connected to one or more of the electronic components.

Example 8 includes the embedded electronic package of example 7, wherein the stretchable body includes an elastomer.

Example 9 includes the embedded electronic package of any one of examples 7 to 8, wherein the plurality of meandering conductors have a serpentine shape.

Example 10 includes the embedded electronic package of any one of examples 7 to 9, and further including at least one via embedded within the stretchable body and extending from the active side of each electronic component; a plurality of conductive pads embedded with the stretchable body, wherein each via and each meandering conductor are electrically connected to one of the pads; and wherein the stretchable body includes openings that expose the conductive pads.

Example 11 includes the embedded electronic package of any one of examples 7 to 10, and further including a textile, wherein the stretchable body is attached to the textile.

Example 12 includes the embedded electronic package of any one of examples 7 to 11, wherein one of the electronic components is at least one of a sensor, a die, a passive, a power supply or an antenna.

Example 13 includes a method of fabricating an embedded electronic package. The method includes attaching a back side of an electronic component to a carrier plate; covering the carrier plate with a stretchable material such that the electronic component is embedded within the stretchable material; forming vias within the stretchable material that are electrically connected to the electronic component; forming meandering conductive traces on a surface of the stretchable material such that the meandering conductive traces are electrically connected the vias; forming conductive pads on the stretchable material such that the conductive pads are electrically connected to the meandering conductive traces; and covering the stretchable material with additional stretchable material such that the conductive pads and the meandering conductive traces are embedded within the stretchable material Example 14 includes the method of example 13, wherein forming vias within the stretchable material that are electrically connected to the electronic component includes laser drilling openings in the stretchable material to expose the electronic component and filling the openings with a conductor.

Example 15 includes the method of any one of examples 13 to 14, and further including forming openings in the stretchable material to expose the conductive pads.

Example 16 includes the method of any one of examples 13 to 15, and further including removing the carrier plate.

Example 17 includes the method of any one of examples 13 to 16, wherein attaching a back side of an electronic component to a carrier plate includes attaching a back side of a plurality of electronic components to the carrier plate, and wherein covering the carrier plate with a stretchable material includes embedding the plurality of electronic components within the stretchable material.

Example 18 includes a method of fabricating an embedded electronic package. The method includes attaching an active side of an electronic component to a first carrier plate; covering the first carrier plate with a stretchable material such that the electronic component is embedded within the stretchable material; removing the first carrier plate; attaching the stretchable material to a second carrier plate; forming vias within the stretchable material that are electrically connected to the electronic component; forming meandering conductive traces on a surface of the stretchable material such that the meandering conductive traces are electrically connected the vias; forming conductive pads on the stretchable material such that the conductive pads are electrically connected to the meandering conductive traces; and covering the stretchable material with additional stretchable material such that the conductive pads and the meandering conductive traces are embedded within the stretchable material.

Example 19 includes the method of example 18, wherein forming vias within the stretchable material that are electrically connected to the electronic component includes laser drilling openings in the stretchable material to expose the electronic component and filling the openings with a conductor.

Example 20 includes the method of any of examples 18 to 19, and further including forming openings in the stretchable material to expose the conductive pads.

Example 21 includes the method of any of examples 18 to 20, and further including removing the second carrier plate.

Example 22 includes the method of any of examples 18 to 21, wherein attaching an active side of an electronic component to a first carrier plate includes attaching an active side of a plurality of electronic components to the first carrier plate, and wherein covering the first carrier plate with the stretchable material includes embedding the plurality of electronic components within the stretchable material.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An embedded electronic package, comprising:
   a stretchable body that includes an upper surface and a lower surface, wherein the stretchable body includes at least one electronic component, wherein each electronic component is fully embedded in the stretchable body and the same distance from the upper surface of the stretchable body, wherein each electronic component is completely surrounded by the stretchable body such that the stretchable body touches each surface of each electronic component; and
   a plurality of meandering conductors that are electrically connected to one or more of the electronic components;
   at least one via embedded within the stretchable body and extending from the active side of each electronic component, wherein each via includes a longitudinal outer surface, wherein the longitudinal outer surface of each via is completely surrounded by the stretchable body such that the stretchable body touches the entire longitudinal outer surface of the via;
   a plurality of conductive pads embedded within the stretchable body, wherein an upper surface of each via is in direct contact with a lower surface of at least one of the meandering conductors and a portion of an upper surface of each meandering conductor is in direct contact with a lower surface of one of the pads; and
   wherein the stretchable body includes openings that expose upper surfaces of the conductive pads.

2. The embedded electronic package of claim 1, wherein the stretchable body includes an elastomer.

3. The embedded electronic package of claim 1, wherein the plurality of meandering conductors have a serpentine shape.

4. The embedded electronic package of claim 1, further comprising a textile, wherein the stretchable body is attached to the textile.

5. The embedded electronic package of claim 1, wherein one of the electronic components is at least one of a sensor, a die, a passive, a power supply or an antenna.

* * * * *